(12) United States Patent
Chen et al.

(10) Patent No.: US 9,093,411 B2
(45) Date of Patent: Jul. 28, 2015

(54) PAD STRUCTURE HAVING CONTACT BARS EXTENDING INTO SUBSTRATE AND WAFER HAVING THE PAD STRUCTURE

(75) Inventors: Ying-Ju Chen, Tuku Township (TW); Hsien-Wei Chen, Sinying (TW); Hao-Yi Tsai, Hsinchu (TW); Mirng-Ji Lii, Sinpu Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 346 days.

(21) Appl. No.: 12/984,669

(22) Filed: Jan. 5, 2011

(65) Prior Publication Data
US 2012/0091455 A1 Apr. 19, 2012

Related U.S. Application Data

(60) Provisional application No. 61/394,477, filed on Oct. 19, 2010.

(51) Int. Cl.
*H01L 21/66* (2006.01)
*H01L 23/00* (2006.01)

(52) U.S. Cl.
CPC ............... *H01L 22/34* (2013.01); *H01L 22/32* (2013.01); *H01L 24/05* (2013.01); *H01L 2224/02166* (2013.01)

(58) Field of Classification Search
CPC ......... H01L 22/34; H01L 23/562; H01L 22/32
USPC ......... 257/48, 618, 620, 678–773; 438/11–18, 438/584

See application file for complete search history.

(56) References Cited

U.S. PATENT DOCUMENTS

| | | | | |
|---|---|---|---|---|
| 5,665,655 | A * | 9/1997 | White | 438/584 |
| 5,702,982 | A * | 12/1997 | Lee et al. | 438/620 |
| 6,495,918 | B1 * | 12/2002 | Brintzinger | 257/758 |
| 7,335,577 | B2 * | 2/2008 | Daubenspeck et al. | 438/462 |
| 7,642,650 | B2 * | 1/2010 | Sugiura et al. | 257/758 |
| 8,742,594 | B2 * | 6/2014 | Daubenspeck et al. | 257/774 |
| 8,810,001 | B2 * | 8/2014 | Hung et al. | 257/532 |
| 2003/0230809 | A1 * | 12/2003 | Nakajima et al. | 257/758 |
| 2006/0012012 | A1 * | 1/2006 | Wang et al. | 257/620 |
| 2006/0022195 | A1 * | 2/2006 | Wang | 257/48 |
| 2008/0042292 | A1 * | 2/2008 | Adkisson et al. | 257/773 |
| 2009/0032929 | A1 * | 2/2009 | Daubenspeck et al. | 257/687 |
| 2009/0121321 | A1 * | 5/2009 | Miccoli et al. | 257/618 |
| 2010/0123135 | A1 * | 5/2010 | Chen | 257/48 |
| 2010/0123219 | A1 * | 5/2010 | Chen et al. | 257/620 |
| 2011/0272790 | A1 * | 11/2011 | Choi et al. | 257/620 |
| 2011/0287627 | A1 * | 11/2011 | Chen et al. | 438/622 |

* cited by examiner

*Primary Examiner* — Eugene Lee
*Assistant Examiner* — Fang-Xing Jiang
(74) *Attorney, Agent, or Firm* — Lowe Hauptman & Ham, LLP

(57) ABSTRACT

A pad structure in a semiconductor wafer for wafer testing is described. The pad structure includes at least two metal pads connected there-between by a plurality of conductive visa in one or more insulation layers. A plurality of contact bars in contact with the bottom-most metal pad extends substantially vertically from the bottom-most metal pad into the substrate. An isolation structure substantially surrounds the plurality of contact bars to isolate the pad structure.

20 Claims, 6 Drawing Sheets

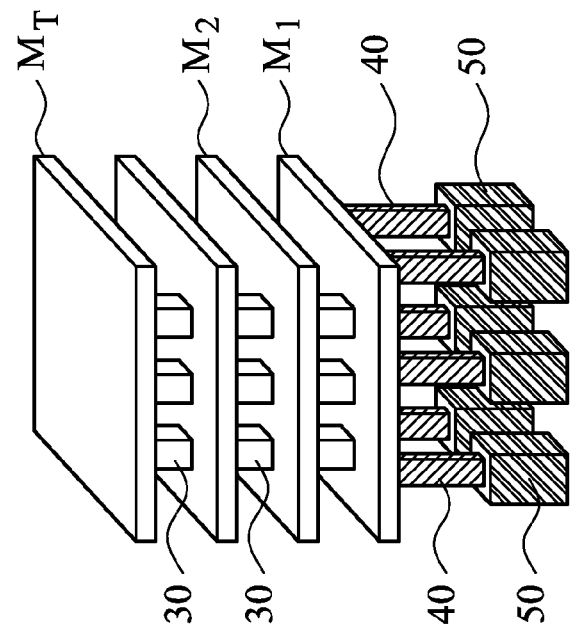
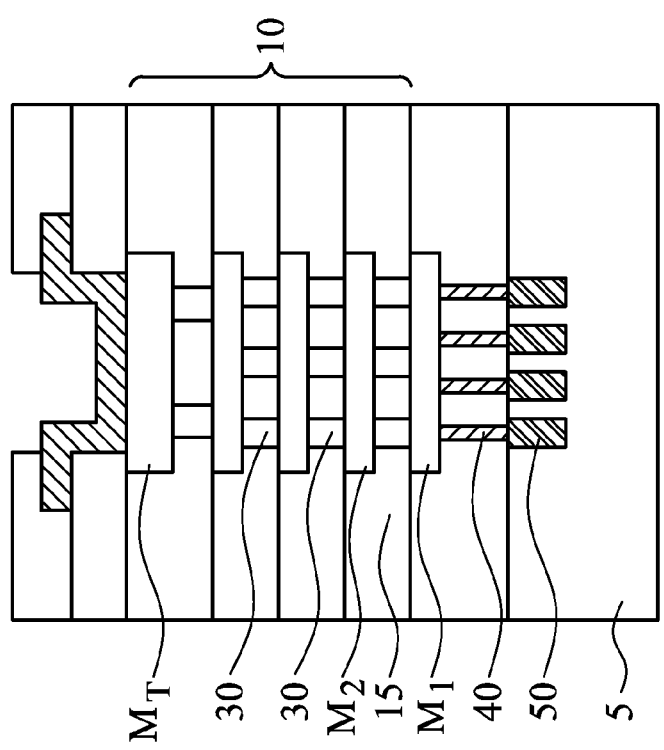
Fig. 3b
Fig. 3a

PAD STRUCTURE HAVING CONTACT BARS EXTENDING INTO SUBSTRATE AND WAFER HAVING THE PAD STRUCTURE

CROSS-REFERENCE TO RELATED APPLICATIONS

The present application claims priority of U.S. Provisional Patent Application Ser. No. 61/394,477, filed on Oct. 19, 2010, which is incorporated herein by reference in its entirety.

FIELD

The disclosure relates generally to semiconductor devices and fabrication techniques and, more particularly, to interconnect structures and test methods.

BACKGROUND

In order to achieve high-integration and high-speed, dimensions of semiconductor integrated circuits have been reduced, and various materials and techniques have been proposed and used during fabrication. For example, dual damascene technology and copper conductors are applied to reduce resistances and resistance-capacitance (RC) delay of interconnect structures in integrated circuits (ICs). As ICs are made smaller, and the distance between adjacent lines is reduced, low dielectric constant (low-k) dielectric materials are used in advanced copper interconnect technology to reduce these delays.

Interconnect structures of a semiconductor IC connect the various active devices and circuits of the IC to a plurality of conductive pads on the top surface of the die. Multi-level interconnect structures have been developed that accommodate the advances in active-device density by more effectively routing conductive paths between the active devices and the surface of the die. In typical IC designs, five or more individual interconnect levels of conductive paths may be used to accommodate the active-device density. Multi-level interconnect structures comprise metallization lines arranged in multiple layers (or levels). The metallization lines of each individual level are formed in an interlevel dielectric (ILD) material. The ILD electrically isolates the metallization lines from one another within each level of the interconnect structures and electrically isolates metallization lines in adjacent levels.

Damascene processes are routinely used in back-end-of-line (BEOL) processing for fabricating multi-level interconnect structures. In a damascene process, trenches and vias are etched in a layer of ILD and filled with a conductive material, such as copper (Cu) or a Cu-based alloy, to create conductive lines and vertical conductive paths between the interconnect lines in different levels.

The conductive paths of the multi-level interconnect structures terminate in bond pads at the surface of the IC. The bond pads are relatively large metal areas distributed throughout at least a top surface of the die. Bond pads are used to establish electrical contact between the integrated circuits and either a package substrate of an IC package or a probe pin (that is used for wafer acceptance testing, or WAT). The pads used during WAT are also referred to as, "process control monitor (PCM) pads." A probe makes an electrical contact between a probe pin and the bond pads, so voltage or current can be applied to the IC for testing device functionality and performance. The bond pads that are used for WAT may be distributed in the scribe lines between dies. These scribe lines are severed during the die singulation process, with the cuts passing through the bond pads.

A conventional approach for configuring the WAT bond pads on the interconnect structure is to include bond pads in the scribe line on each interconnect layer, aligned beneath the bond pads in scribe line of the top metal layer, and to include metal-filled vias connecting the bond pads in each of the interconnect levels, aligned beneath each bonding pad or probe pad in the top metal layer. The bond pads in the first interconnect (M1) layer may be used for in situ testing before the second (M2) through top metal (MT) layers are formed.

The dicing (or singulation) process can produce a large mechanical stress, which may be dependent on numerous conditions, including: cut width, die saw speed, die saw temperature, die saw pressure, etc.

Conventional multi-level interconnect structures have been susceptible to failure due to cracking when the PCM pad is cut by a die saw. Experience has shown that during singulation, the dielectric in the scribe lines may crack in the vicinity of the bond pads, and that these cracks may propagate to the dies. This problem becomes more acute when low-k dielectric materials (including extreme low-k, ELK and ultra low-k, ULK) are used for the ILD material, because low-k dielectric materials are more brittle than high-k dielectrics.

BRIEF DESCRIPTION OF DRAWINGS

The features, aspects, and advantages of the disclosure will become more fully apparent from the following detailed description, appended claims, and accompanying drawings in which:

FIG. 1b is a perspective view of the PCM pad structure of FIG. 1a.

FIG. 2b is a perspective view of the PCM pad structure of FIG. 2a.

FIG. 2c is a cross sectional view of a portion of a PCM pad structure in a scribe line of a semiconductor wafer, according to at least one embodiment.

FIG. 3a is a cross sectional view of a portion of a PCM pad structure in a scribe line of a semiconductor wafer, according to a third embodiment.

FIG. 3b is a perspective view of the PCM pad structure of FIG. 3a.

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

In semiconductor products where low-K dielectric materials are used, cracking has been observed when the PCM pad is cut. The cracking mechanism is complex, but experiences have shown that it is strongly related to the brittle dielectric materials used in the ILD layer when the die saw blade moves across the PCM pad in the scribe lines of the wafer during singulation. When the die saw blade contacts the metal structure of the PCM pads, the probability of crack formation is increased.

Figure 1B:
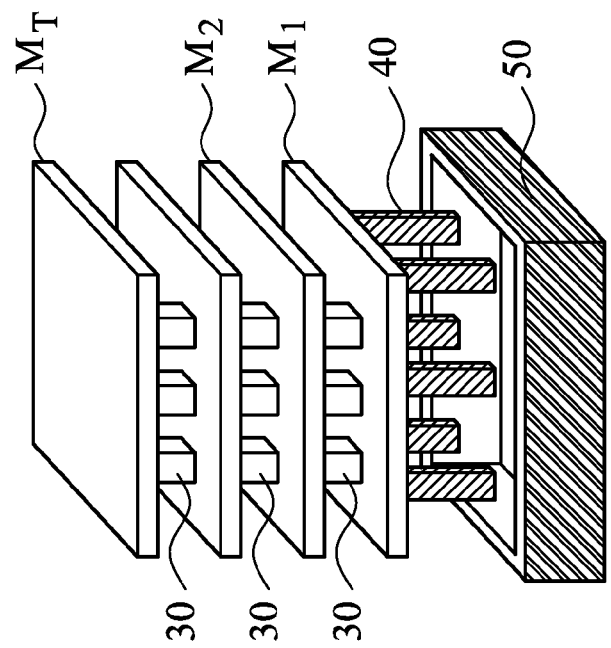

To increase IC reliability and reduce the likelihood of cracking to the dies when the PCM pad is cut by a die saw, the PCM pad structure needs to be reinforced. In some embodiments, the reinforcement of a PCM pad is accomplished by forming a plurality of contact bars. The contact bars contact the first metal layer M1 of the PCM pad structure and are embedded into the substrate (as shown in FIG. 1c) to serve as pillars to reduce the likelihood of the PCM pad structure from peeling off during a die saw process.

Figure 1A:
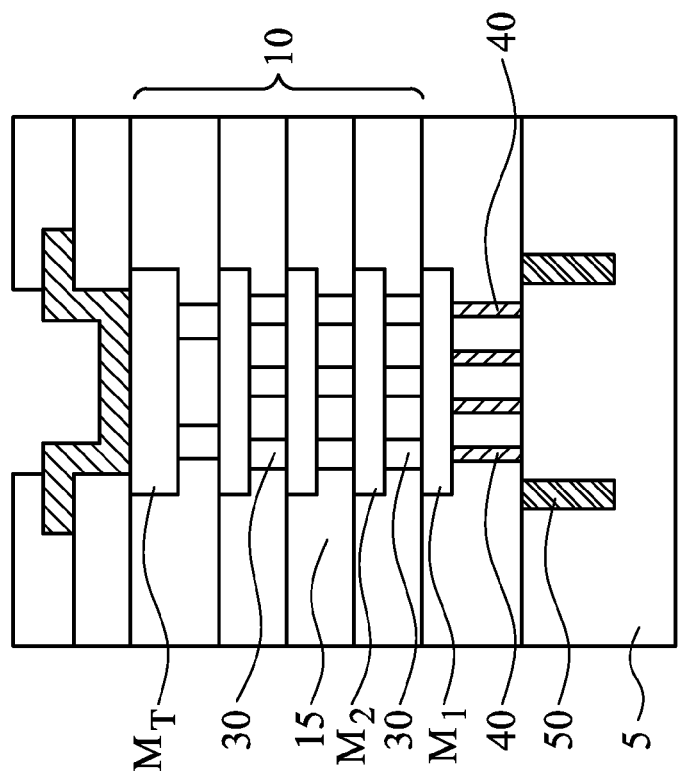
FIG. 1a is a cross sectional view of a portion of a PCM pad structure in a scribe line of a semiconductor wafer, according to a first embodiment.
Figure 1C:
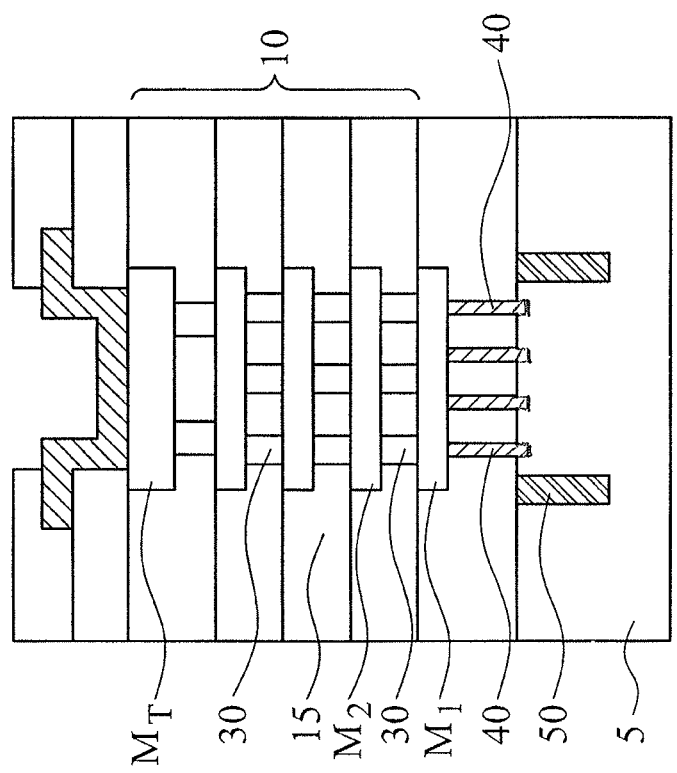
FIG. 1c is a cross sectional view of a portion of a PCM pad structure in a scribe line of a semiconductor wafer, according to at least one embodiment.

FIG. 1a depicts a cross-sectional portion of an exemplary PCM pad structure 10 having contact bars 40 and an isolation structure 50 formed in a substrate 5, according to a first embodiment. FIG. 1b is a perspective view of the PCM pad structure of FIG. 1a. The PCM pad structure 10 may be formed on a portion of the process wafer where a multi-level integrated circuit semiconductor device is formed or on a portion where no electrical devices are formed nearby. For example, the PCM pad structure 10 is first formed with a lower (first) metal layer M1 (e.g., copper or copper alloys), formed in a dielectric insulating layer 15. Conventional processes may be carried out to form metal layer M1 including patterning, etching trench openings in the insulating layer 15, forming barrier layers to line the openings, filling the openings with metal, and carrying out a planarization process, e.g., a CMP process, to planarize the metal filled damascene.

Following the planarization step, an overlying metal layer M2 is formed including conductive vias 30 in electrical communication with metal layer M1. It will be appreciated that metal layer M2 and conductive vias 30 may be formed separately or by a dual damascene process.

The PCM pad structure 10 of FIG. 1a also includes a plurality of contact bars 40 in electrical contact with metal layer M1 and extending substantially vertically from metal layer M1 into the substrate 5. Contact bars 40 serve as the pillars for PCM pad structure 10 by reducing the likelihood of the PCM pad structure 10 from peeling off during a singulation process and hence cracks from forming and propagating to the dies. Contact bars 40 may be formed prior to the formation of the first metal layer M1 and formed by a single or dual damascene process. Contact bars 40 may be formed of a material such as tungsten, copper, copper alloys, or aluminum. Other conductive materials are also contemplated. It will be appreciated that the number, shape, widths and/or lengths of the contact bars 40 may each or all be varied. However, the number, shape, widths, and/or lengths of the contact bars depend on the amount of support needed to reinforce the PCM pad structure 10 and prevent the PCM pad structure from peeling off during a die saw process and causing cracks to form and propagate to the dies.

Between any two adjacent PCM pad structures 10 that have contact bars 40, there may be current leakage that may influence the electrical test accuracy of the test pattern or lead to other undesirable electrical effects. To prevent current leakage from one PCM pad structure to another PCM pad structure or other devices in the wafer, an isolation structure 50 is formed around the contact bars 40, thereby isolating the PCM pad structure. FIG. 1a shows the isolation structure 50 as having substantially a square or rectangular shape. It will be appreciated, however that the shape of the isolation structure 50 is not limited to the example in FIGS. 1a and 1b but that the shape, along with the widths, lengths, and/or thickness of the isolation structure 50 may each or all be varied. For example, isolation structure 50 may have a circular shape.

In at least one embodiment, the isolation structure 50 comprises oxide and has a thickness D from about 500 Angstroms (Å) to about 2,500 Å. Preferably, the isolation structure 50 has a thickness sufficient for electrical isolation between devices in the wafer. In at least one embodiment, the isolation structure 50 has a thickness from about 500 Å to about 1,000 Å. In some embodiments the isolation structure 50 may be a shallow trench isolation (STI) region and comprising oxide. Other isolation materials are also contemplated. The STI region may be formed by the steps of trench etch, oxide fill, and oxide polish. In some other embodiments, the isolation structure may be a field oxide (FOX) layer comprising oxide and having a thick layer of oxide between 2,500 Å to 15,000 Å thick to prevent the migration of electrical charge.

Figure 2B:
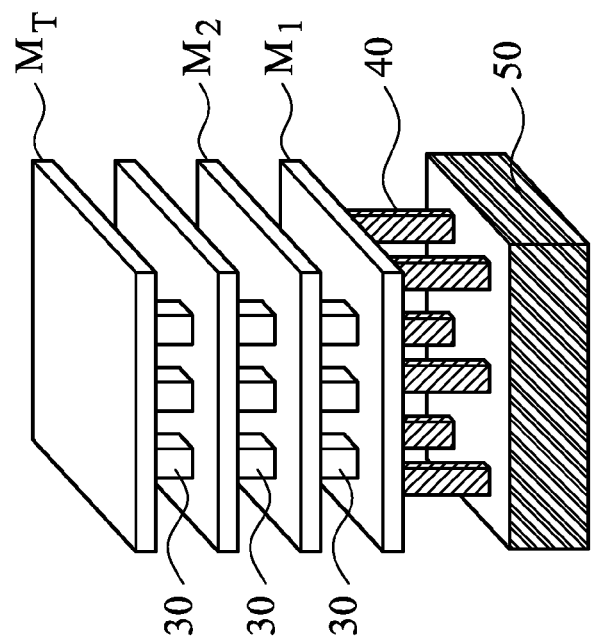
Figure 2A:
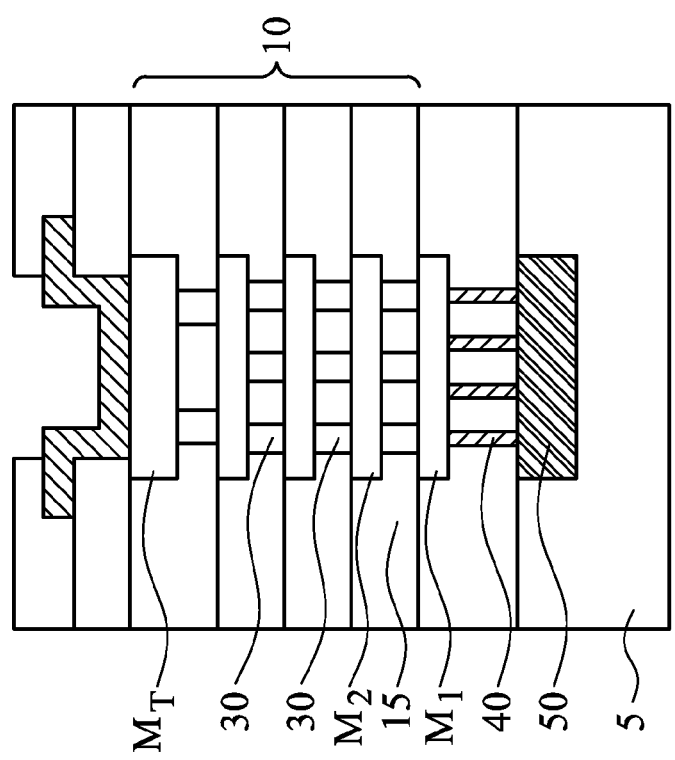
FIG. 2a is a cross sectional view of a portion of a PCM pad structure in a scribe line of a semiconductor wafer, according to a second embodiment.
Figure 2:
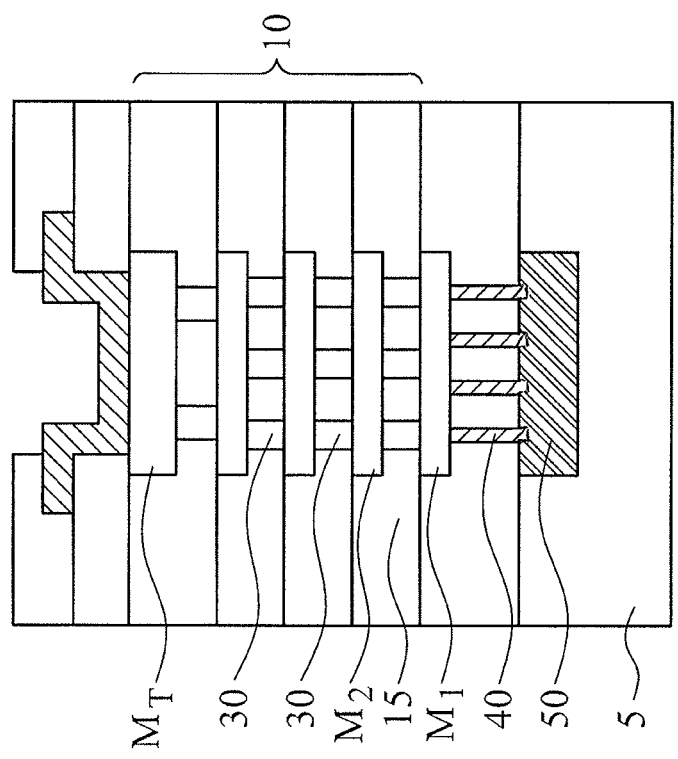

In another embodiment as depicted in FIGS. 2a and 2b, the isolation structure 50 electrically contacts the plurality of contact bars 40, thereby isolating the PCM pad structure 10 from other devices in the wafer. In some embodiments, the plurality of contact bars 40 extends substantially into the isolation structure 50 (as shown in FIG. 2c).

Figure 3C:
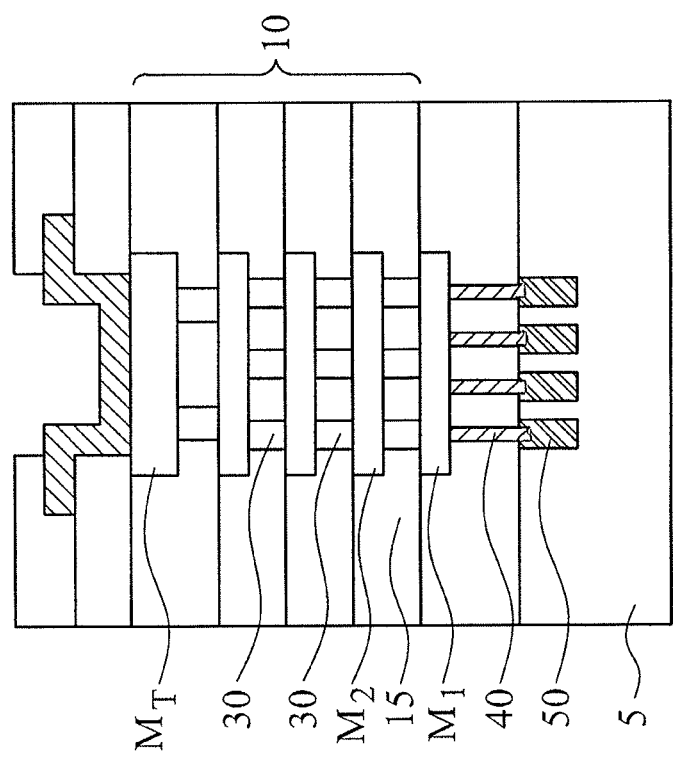
FIG. 3c is a cross sectional view of a portion of a PCM pad structure in a scribe line of a semiconductor wafer, according to at least one embodiment.

In yet another embodiment as depicted in FIGS. 3a and 3b, each of the plurality of isolation structures 50 is connected to one of the plurality of contact bars 40 to isolate the PCM pad structure from other devices. In other embodiments, each of the plurality of isolation structures 50 substantially surrounds one end of the corresponding one of the plurality of contact bars 40. In some embodiments, the plurality of contact bars 40 extends substantially into the corresponding isolation structures 50 (as shown in FIG. 3c).

Embodiments of the PCM pad structures have now been described. The PCM pad structures have the advantages of increasing the IC reliability during testing by reducing the likelihood of cracks from forming and propagating to the dies during a die saw process and isolating the PCM pad structures from other devices in the wafer from electrical charge leakage.

In the preceding detailed description, the present invention is described with reference to specifically exemplary embodiments thereof. It will, however, be evident that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the invention as expressed herein.

What is claimed is:

1. A wafer, comprising:
a substrate having a plurality of integrated circuits on the substrate, and at least one scribe line surrounding at least one of the integrated circuits;
a plurality of dielectric layers in the at least one scribe line having an aligned process control monitor (PCM) pad formed therein, the PCM pad having a plurality of metal layers interconnected there-between by a plurality of conductive visa;
a plurality of isolation structures in the substrate; and
a plurality of contact bars in contact with a bottom-most metal layer, each contact bar of the plurality of contact bars extending from the bottom-most metal layer to land on a top surface of a separate isolation structure of the plurality of isolation structures, wherein a bottom surface of at least one contact bar of the plurality of contact bars is coplanar with a top surface of the separate isolation structure of the plurality of isolation structures.

2. The wafer of claim 1, wherein the plurality of isolation structures include an STI region or a field oxide layer.

3. The wafer of claim 1, wherein the plurality of isolation structures are formed of oxide.

4. The wafer of claim 1, wherein each of the contact bars comprises at least one selected from the group consisting of tungsten, copper, copper alloys, and aluminum.

5. The wafer of claim 1, wherein a peripheral edge of the each isolation structure of the plurality of isolation structures substantially contours to only one of the plurality of contact bars to isolate the PCM pads.

6. A process control monitor (PCM) pad structure in a scribe line, the PCM pad structure comprising:
at least two metal layers connected there-between by a plurality of conductive visa;
a plurality of isolation structures in a substrate; and
a plurality of contact bars in contact with a bottom-most metal layer, each single contact bar of the plurality of contact bars extending substantially vertically from the bottom-most metal layer to land on a top surface of a corresponding single isolation structure of the plurality of isolation structures, wherein a bottom surface of at least one contact bar of the plurality of contact bars is coplanar with the to surface of the corresponding single isolation structure of the plurality of isolation structures.

7. The PCM pad structure of claim 6, wherein at least one isolation structure is an STI region.

8. The PCM pad structure of claim 6, wherein at least one isolation structure of the plurality of isolation structures is formed of oxide.

9. The PCM pad structure of claim 6, wherein
the plurality of isolation structure includes first and second isolation structures separate from each other,
a peripheral edge of the first isolation structure substantially surrounds a first one of the plurality of contact bars and a peripheral edge of the second isolation structure substantially contours to a second one of the plurality of contact bars to isolate the PCM pad structure, and
the first contact bar is separate from the second contact bar.

10. The PCM pad structure of claim 6, wherein at least one isolation structure is a field oxide layer.

11. The PCM pad structure of claim 6, wherein each of the contact bars comprises at least one selected from the group consisting of tungsten, copper, copper alloys, and aluminum.

12. A wafer, comprising:
a substrate having a plurality of integrated circuits, wherein the substrate comprises at least one scribe line surrounding at least one integrated circuit of the plurality of integrated circuits; and
a plurality of dielectric layers in the at least one scribe line having a process control monitor (PCM) pad structure, the PCM pad structure comprising:
a plurality of metal layers interconnected by a plurality of conductive vias; and
a plurality of contact bars extending from a bottom-most metal layer, wherein each individual contact bar of the plurality of contact bars lands on a top surface of a corresponding one isolation structure of a plurality of isolation structures, wherein a bottom surface of at least one contact bar of the plurality of contact bars is coplanar with the to surface of the corresponding one isolation structure of the plurality of isolation structures.

13. The wafer of claim 12, wherein each isolation structure of the plurality of isolation structures is an STI region.

14. The wafer of claim 12, wherein each isolation structure of the plurality of isolation structures is a field oxide layer.

15. The wafer of claim 12, wherein each contact bar of the plurality of contact bars comprises at least one selected from the group consisting of tungsten, copper, copper alloys, and aluminum.

16. A process control monitor (PCM) pad structure in a scribe line, the PCM pad structure comprising:
a first metal layer over a substrate;
a second metal layer over the first metal layer;
at least one conductive via connected to the first metal layer and the second metal layer;
a plurality of isolation structures in the substrate; and
a plurality of contact bars in contact with the first metal layer, each contact bar of the plurality of contact bars extending from the first metal pad to land on a top surface of a corresponding isolation structure of the plurality of isolation structures, wherein each isolation structure of the plurality of isolation structures is spaced apart from adjacent isolation structures of the plurality of isolation structures, and wherein a ratio of the each contact bar of the plurality of contact bars to the corresponding isolation structure of the plurality of isolation structures is 1:1, wherein a bottom surface of at least one contact bar of the plurality of contact bars is coplanar with the top surface of the corresponding isolation structure of the plurality of isolation structures.

17. The PCM pad structure of claim 16, wherein each isolation structure of the plurality of isolation structures is an STI region.

18. The PCM pad structure of claim 16, wherein each isolation structure of the plurality of isolation structures is a field oxide layer.

19. The PCM pad structure of claim 16, wherein each of the contact bars comprises at least one selected from the group consisting of tungsten, copper, copper alloys, and aluminum.

20. The wafer of claim 16, wherein a peripheral edge of each of the plurality of isolation structures substantially contours to at least one contact bar of the plurality of contact bars.

* * * * *